United States Patent [19]
Yamaguchi

[11] Patent Number: 4,635,234
[45] Date of Patent: Jan. 6, 1987

[54] MEMORY CIRCUIT WITH AN IMPROVED OUTPUT CONTROL CIRCUIT

[75] Inventor: Takashi Yamaguchi, Tokyo, Japan
[73] Assignee: NEC Corporation, Tokyo, Japan
[21] Appl. No.: 630,799
[22] Filed: Jul. 13, 1984
[30] Foreign Application Priority Data
  Jul. 15, 1983 [JP] Japan .................................. 58-129007
[51] Int. Cl.⁴ .............................................. G11C 11/40
[52] U.S. Cl. .................................... 365/233; 365/189; 365/194; 365/241
[58] Field of Search ............... 365/189, 194, 233, 239, 365/240, 241

[56] References Cited
U.S. PATENT DOCUMENTS
4,425,633  1/1984  Swain .................................. 365/194
4,503,490  3/1985  Thompson .......................... 365/233

Primary Examiner—Terrell W. Fears
Attorney, Agent, or Firm—Sughrue, Mion, Zinn, Macpeak, and Seas

[57] ABSTRACT

A memory circuit of the type having a plurality of output circuits whose peak currents can be reduced. A plurality of timing signals are generated at different time points, and applied to sequentially enable the plurality of output circuits.

10 Claims, 9 Drawing Figures

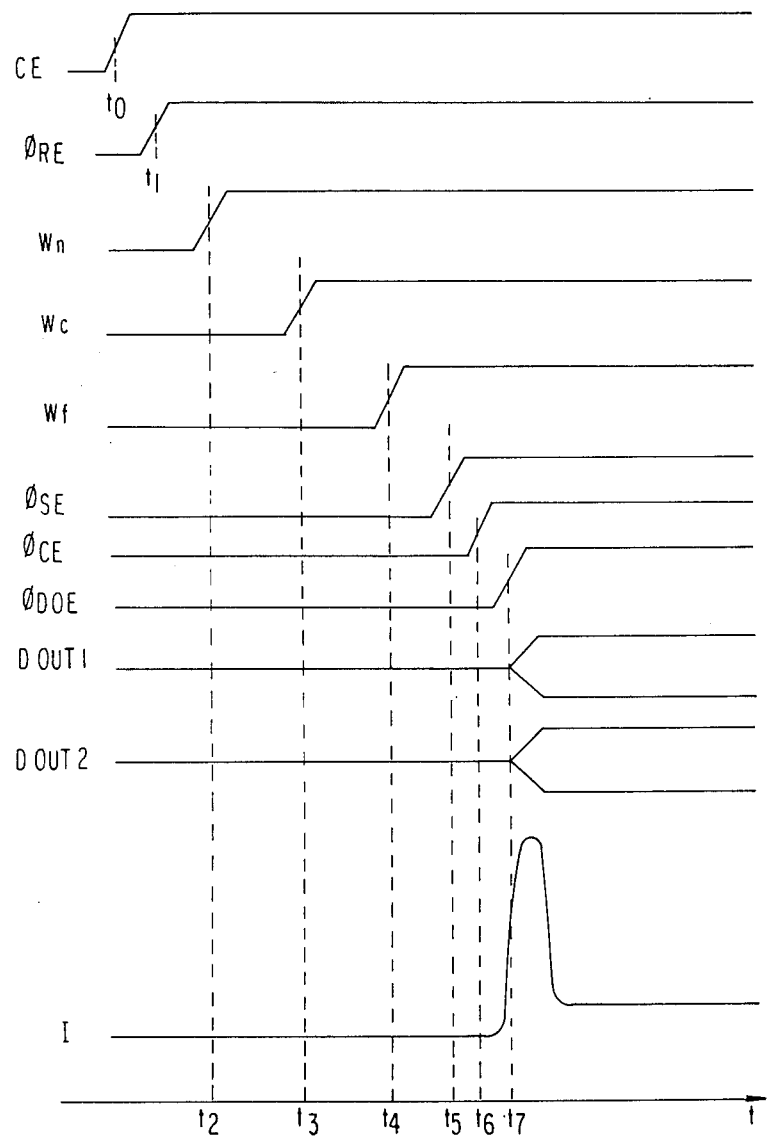

MEMORY CIRCUIT WITH AN IMPROVED OUTPUT CONTROL CIRCUIT

BACKGROUND OF THE INVENTION

The present invention relates to memory circuits, and more specifically to multibit-output memory circuits having a plurality of output circuits.

The demand for multibit-output memory circuits has been increasing. A multibit-output memory includes a plurality of data output circuits connected to a plurality of data output terminals. Plural output data can thereby by supplied, increasing the amount of information that can be provided per access of the memory.

The memory cells included in a memory are divided into a plurality of groups, each associated with one of the data output circuits, and hence the number of memory cells associated with each data output circuit is remarkably reduced. Accordingly, the capacitance load on each output circuit can be made small so that each output circuit can operate at a high speed.

As described above, the multibit-output memories have been advantageously utilized in many information processing systems. However, the increased number of output circuits causes an increase in the peak current. The output circuits operate in parallel and the total amount of switching current is large. Such peak switching currents produce noise which causes a voltage drop within the memory itself and adversely affects the operation of the memory. The peak value of the switching current could be reduced by decreasing the driving ability of each output circuit. However, this method would require a large amount of switching time for driving loads by the reduced ability of output circuits, resulting in a low speed operation. Thus, reducing the driving ability of the output circuits is not a practical solution.

SUMMARY OF THE INVENTION

It is an object of the present invention to provide a multibit-output type memory which has lower peak current and reduced noise.

It is another object of the present invention to provide a multibit-output type memory operable at a high speed. A multibit-output memory according to the present invention comprises a plurality of output circuits each for outputting data. The plurality of output circuits are separately activated at different times. In other words, according to the present invention, instead of activating all the output circuits simultaneously, the output circuits are separately activated at different times. Therefore, peak currents caused in the respective output circuits are distributed over time, and hence the effective peak current generated in the memory can be moderated. Thus, the peak value of the switching current is reduced, and noise caused in the memory can be effectively reduced.

BRIEF DESCRIPTION OF THE DRAWINGS

FIG. 2 is a waveform chart of the waveforms of signals at various portions of the memory circuit of FIGS. 1 and 1a;

FIG. 4 is a waveform chart of the waveforms of signals at various portions of the memory circuit of FIGS. 3 and 3a;

DETAILED DESCRIPTION

Figure 1:
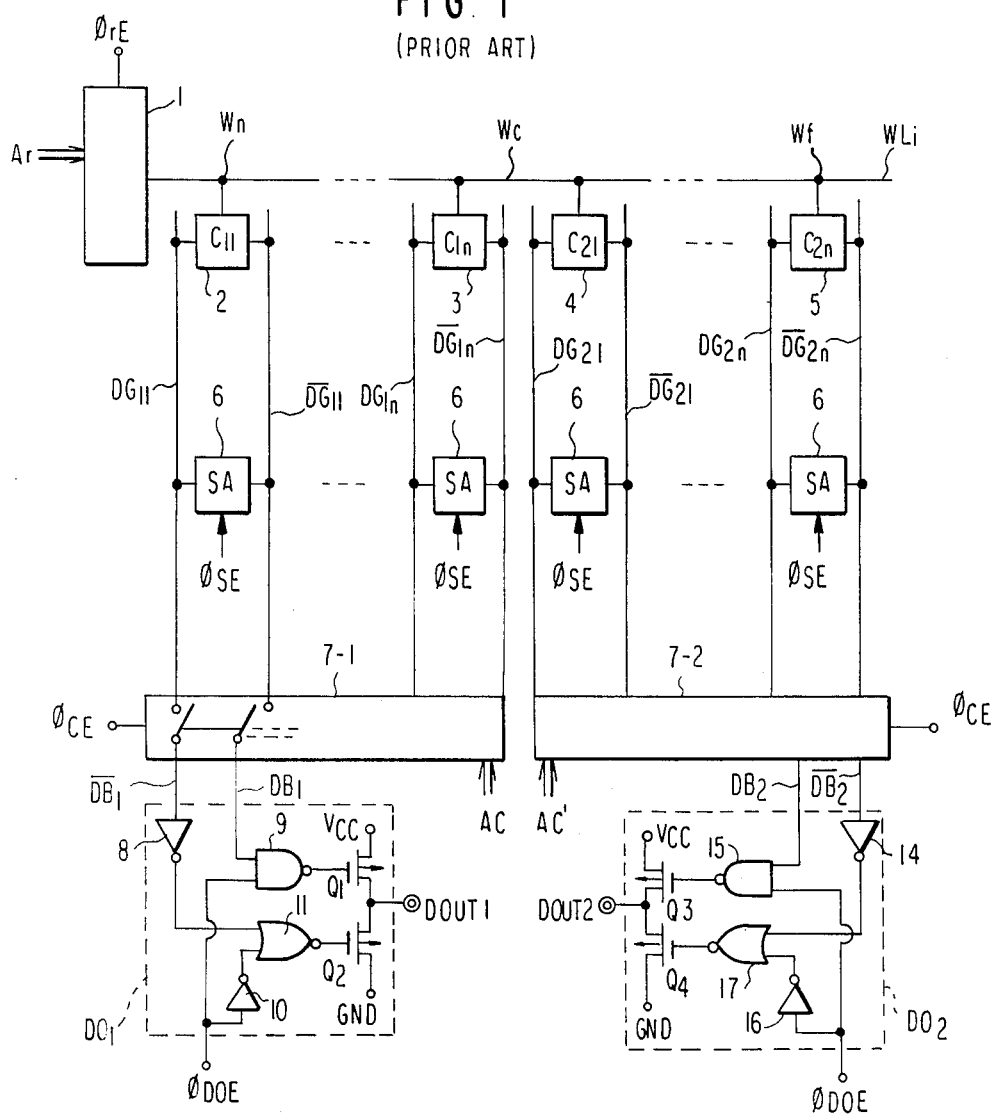
FIG. 1 is a circuit diagram of a conventional memory circuit.
Figure 1A:
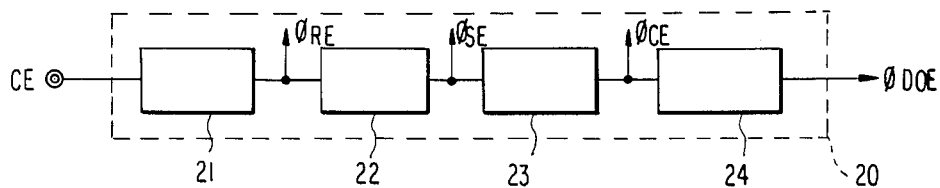
FIG. 1a is a block diagram of a timing circuit for FIG. 1.

With reference to FIGS. 1, 1a and 2, a multibit-output type memory according to the prior art will be explained.

As shown in FIG. 1, a plurality of random access memory cells $C_{1l}$ to $C_{1n}$ and $C_{2l}$ to $C_{2n}$ are arranged at intersections of word lines $WL_i$ (only one illustrated) and a plurality of pairs of digit lines (DG1l, $\overline{DG1l}$) ... (DG1n, $\overline{DG1n}$) and (DG2l, $\overline{DG2l}$) ... (DG2n, $\overline{DG2n}$). In FIG. 1, one row of memory cells $C_{11}$ to $C_{2n}$ coupled to one word line $WL_i$ are representatively illustrated. The digit line pairs (DG1l, $\overline{DG1l}$) to (DG1n, $\overline{DG1n}$) are inputted to a first column selection circuit 7-1, while the digit line pairs (DG2l, $\overline{DG2l}$) to (DG2n, $\overline{DG2n}$) are inputted to a second column selection circuit 7-2.

The column selection circuit 7-1 operatively selects one pair of digit lines for connection to a pair of bus lines DB1 and $\overline{DB1}$ based on column address information AC. Similarly, the column selection circuit 7-2 operatively selects one pair of digit lines for connection to a pair of bus lines DB2 and $\overline{DB2}$. The pair of bus lines DB1 and $\overline{DB1}$ are inputted to a first output circuit $\overline{DO1}$, and the pair of bus lines DB2 and $\overline{DB2}$ are inputted to a second output circuit DO2. Thus the memory cells illustrated are divided into two groups associated with the output circuits DO1 and DO2, respectively.

A timing signal generator 20, illustrated in FIG. 1a, includes delay circuits 21 to 25 connected in cascade. The delay circuit 21 receives a chip enable signal CE from a source external to the memory and generates a timing signal $\phi_{RE}$ for activating a row decoder 1 after a given delay period. The delay circuit 22 generates a timing signal $\phi_{SE}$ for activating sense amplifiers 6. The delay circuit 23 generates a timing signal $\phi_{CE}$ for enabling the column selection circuits 7-1 and 7-2. The delay circuit 24 generates a timing signal $\phi_{DOE}$ for activating the output circuits DO1 and DO2.

As is well known, each word line has a resistance R in its longitudinal direction and forms a stray capacitance C with its peripheral material. Consequently, the word line acts like a distributed delay line. Therefore, the far end $W_f$ of the word line $WL_i$ has a time constant RC with respect to the near end $W_n$, to which a word line active signal is applied by the row decoder 1. Accordingly, the timing signal $\phi_{SE}$ must be generated after operation of the memory cell, $C_{2n}$, connected to the far end $W_f$. In general, word lines are made of polycrystalline silicon having a relatively large sheet resistance. The propagation delay of the signal on a selected word line is very large, and could easily occupy 20 to 30 percent of the entire access time of a memory.

The operation of the memory of FIGS. 1 and 1a will be explained with reference to FIG. 2.

The chip enable signal CE changes from a low level to a high level at a time point $t_0$ so that the signal CE is activated. In response to the activation of CE, the timing signal $\phi_{RE}$ is activated at a time $t_1$ so that the row decoder 1 is enabled to select one of the word lines, e.g., $WL_i$. Then, potentials at the near end $W_n$, a central portion $W_c$ and the far end $W_f$ of the selected word line rise, respectively, at timing points $t_2$, $t_3$ and $t_4$. Therefore data stored in the memory cell $C_{2n}$ connected to the far end $W_f$ cannot be read until after the time point $t_4$. In response to the activation of the timing signal $\phi_{SE}$ at a timing point $t_5$, the sense amplifiers 6 are enabled to amplify signals read on associated digit lines. At a time point $t_6$, the timing signal $\phi_{CE}$ is activated so that the column selection circuit 7-1 connects one of the digit line pairs (DG11, $\overline{DG11}$) to (DG1n, DG1n) to the bus lines DB1 and $\overline{DB}1$, while the column selection circuit 7-2 selects one pair of digit lines to be connected to the output circuit DO2 via the bus lines DB2 and $\overline{DB}2$. At a time point $t_7$, the timing signal $\phi_{DOE}$ is activated so that the output circuits DO1 and DO2 simultaneously start their amplification operations. In this instance, when the bus lines DB1 and $\overline{DB}1$ are at high and low voltage levels, respectively, a P-channel transistor $Q_1$ becomes conducting in response to a low level output of a NAND gate 9 while an N-channel transistor $Q_2$ continues non-conducting because an output of NOR gate 11 is at a low level so that the potential at an output terminal $D_{OUT1}$ rises toward the power voltage Vcc through the transistor $Q_1$ to charge the load connected to the output terminal $D_{OUT1}$ in the output circuit DO1.

When the bus lines DB1 and $\overline{DB}1$ are at low and high voltage levels, respectively, the transistor $Q_2$ becomes conducting to discharge the potential at the output terminal $D_{OUT1}$ to ground in response to a high level output of the gate 11. The operation of output circuit DO2 is similar to that of output circuit DO1.

In this memory, when both $DB_1$ and $DB_2$ are at high voltage levels, both $\overline{DB}1$ and $\overline{DB}2$ are at low voltage levels, the transistors $Q_1$ and $Q_3$ simultaneously become conducting to charge the loads connected to the output terminals $D_{OUT1}$ and $D_{OUT2}$, respectively, in response to the activation of the timing signal $\phi_{DOE}$. Therefore, large currents simultaneously flow through the transistors $Q_1$ and $Q_3$ to the loads connected to the output terminals $D_{OUT1}$ and $D_{OUT2}$ at time point $t_7$ as indicated at "I" in FIG. 2. This peak current I in the output circuits is a cause of a voltage drop generated accross the voltage wiring within the memory. Namely, depending upon the resistance of the wiring for feeding the power voltage Vcc, the peak current I causes a large voltage drop in the power voltage wiring and that in turn causes a malfunction of circuits, such as the row decoder. Also, the above problem occurs when the bus lines DB1 and DB2 are at low voltage levels and both $\overline{DB}1$ and $\overline{DB}2$ are at high voltage levels. The transistors $Q_2$ and $Q_4$ simultaneously become conducting in response to the activation signal $\phi_{DOE}$. In this case, a large discharge current flows through the transistors $Q_2$ and $Q_4$ from the output terminals towards the ground wiring. This discharge current also causes a large voltage drop in the wiring for feeding the ground potential within the memory.

Figure 7:
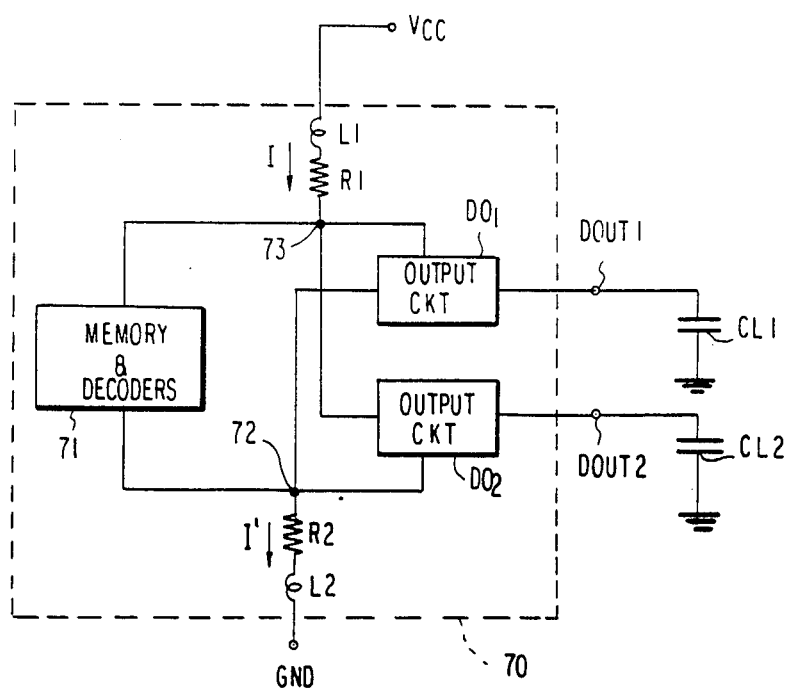
FIG. 7 is a block diagram explaining the problem in the prior art.

With reference to FIG. 7, the above mentioned voltage drop will be explained in more detail. A memory chip 70 includes two output circuits D01 and D02 and a functional block 71, including a memory cell array and decoders. A Vcc wiring 73 is connected to the respective blocks 71, DO1 and DO2 and includes a resistance R1 and an inductance $L_1$. Also, the ground wiring 72 is connected to these blocks and includes a resistance $R_2$ and an inductance $L_2$.

When the two loads $CL_1$ and $CL_2$ are charged to the voltage Vcc, a large amount of current I flows from the Vcc terminal through the Vcc wiring 73. In this instance, a voltage drop $\Delta V$ which is defined by $\Delta V = I \times (R_1 + L_1\, di/dt)$ is generated within the Vcc wiring 73 due to its resistance $R_1$ and inductance $L_1$. This voltage drop adversely affects the operation of block 71 as well as the output circuits DO1 and DO2.

Similarly, when the charges stored at the loads CL1 and CL2 are discharged by the output circuits DO1 and DO2, the large amount of discharge current I' flows in the ground wiring 72 and causes a voltage drop $\Delta V'$ which is defined as $\Delta V' = I' \times (R_2 + L_2\, di/dt)$ due to the resistance $R_2$ and the inductance $L_2$ of the ground wiring itself. As described above, the switching current causes the voltage drop within the memory and adversely affects the operation of the memory.

Furthermore, the timing of the read-out operation of the prior art memory is based on the time of operation of the memory cell coupled to the far end of the selected word line. Therefore, read-out from the memory cells coupled to the near end of the word line is unnecessarily delayed.

The typical value of $t_7$, i.e., the access time of the prior art memory, is 16 nsec for a 16K static RAM wherein the word lines are made of aluminum, and the value of $t_3$ is typically about 1 nsec. Also, the peak value of the current is about 3 mA. For the 16K static RAM memory wherein the word lines are made of polycrystalline silicon, the value of $t_7$ is 25 nsec and the value of $t_3$ is 10 nsec.

Figure 3:
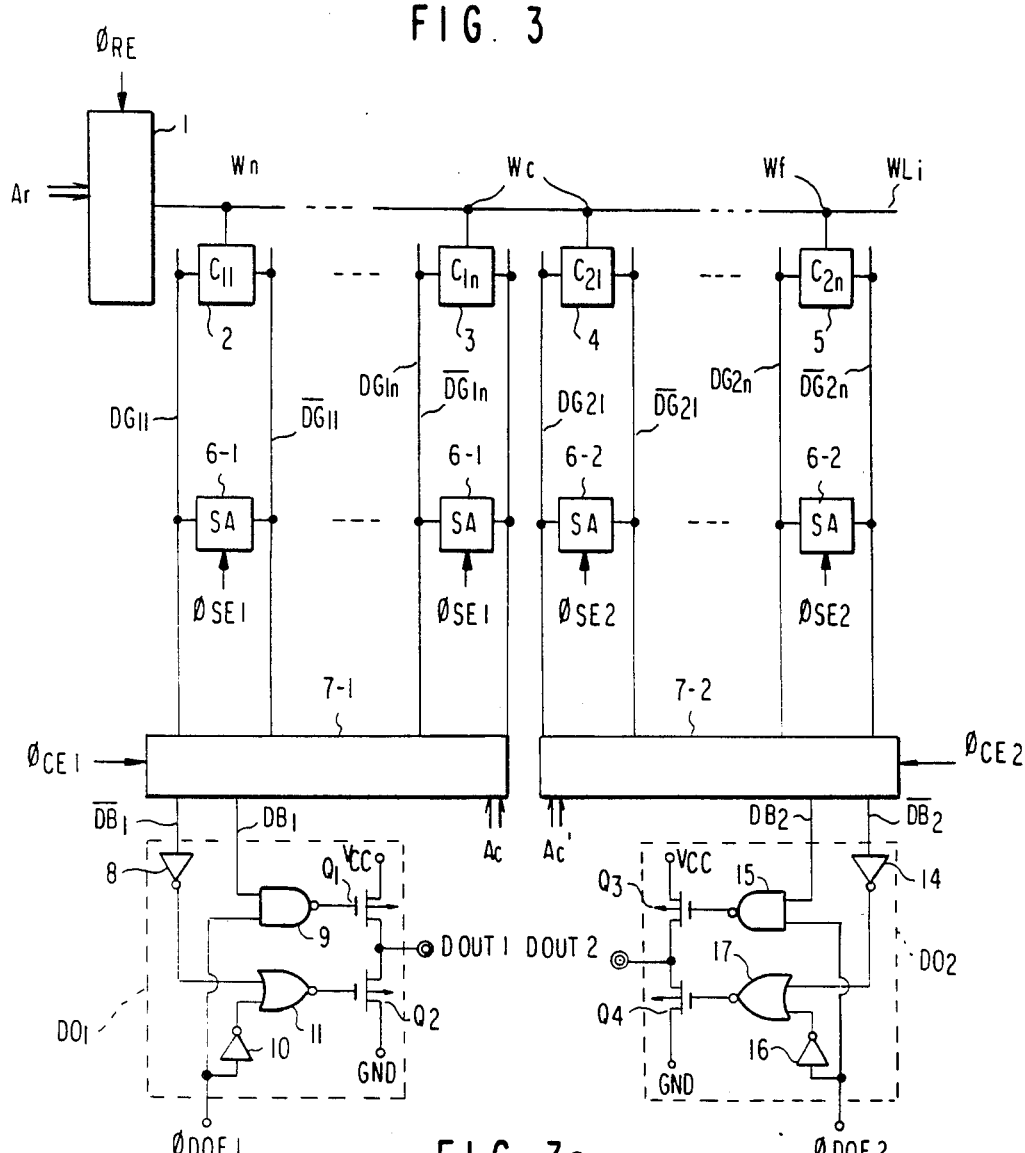
FIG. 3 is a circuit diagram of an embodiment of the memory circuit in accordance with the present invention.

With reference to FIG. 3, a multibit-output type memory according to one embodiment of the present invention will be explained. In the drawing, components corresponding to those in FIG. 1 are designated by similar reference numerals and letters.

In this embodiment, the sense amplifiers 6-1 associated with the memory cells ($C_{1l}$~$C_{1n}$) coupled to the word lines at locations between the near end $W_n$ and the center portion $W_c$ of the word lines are adapted to be activated by a timing signal $\phi_{SE1}$, while the sense amplifiers 6-2 associated with the memory cells ($C_{2l}$ to $C_{2n}$) coupled to the word lines at locations between the central portion $W_c$ and the far end $W_f$ are adapted to be activated by a timing signal $\phi_{SE2}$, which is generated after the signal $\phi_{SE1}$. The column selection circuit 7-1 is controlled by a timing signal $\phi_{CE1}$ while the column selection circuit 7-2 is controlled by a different timing signal $\phi_{CE2}$ generated after the generation of the signal $\phi_{CE1}$. Also, the output circuits DO1 and DO2 are activated by different timing signals $\phi_{DOE1}$ and $\phi_{DOE2}$, respectively. The signal $\phi_{DOE2}$ is generated after the generation of $\phi_{DOE1}$.

Figure 3A:
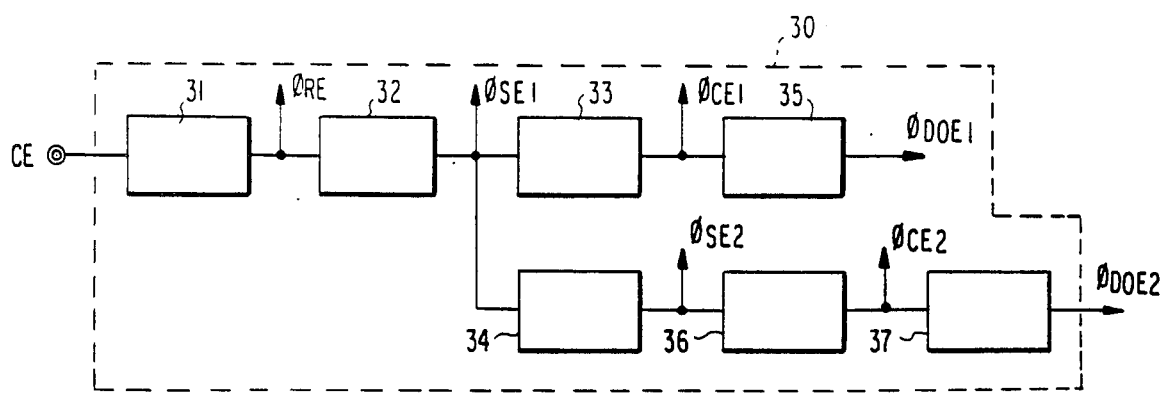
FIG. 3a is a block diagram of a timing circuit for FIG. 3.

A timing signal generator circuit 30 for generating the above timing signals includes delay circuits 31 to 37, as illustrated in FIG. 3a. The delay circuit 31 receives a chip enable signal CE from an external source to generate the timing signal $\phi_{RE}$ for controlling the row decoder 1. The delay circuit 32 generates the timing signal $\phi_{SE1}$ after generation of the timing signal $\phi_{RE}$. The delay time of delay circuit 32 is selected so that the signal $\phi_{SE1}$ is generated directly after the information stored in the cells coupled to the digit line pairs (DG11, DG1l) to (DG1n, $\overline{DG1n}$) is sufficiently transmitted to the digit line pairs. The delay circuit 33 generates timing signal $\phi_{CE1}$ in response to signal $\phi_{SE1}$. The delay time of the delay circuit is selected to correspond with the operation time of the sense amplifiers 6-1. The delay circuit 35, which generates the signal $\phi_{DOE1}$ in response to the signal $\phi_{CE1}$, has a delay time that corresponds to the operation time of the column selection circuit 7-1. The delay circuit 34 has a delay time which corresponds responds to a period required for transmitting the selection level on the word line from its center portion $W_c$ to its far end $W_f$ and generates the timing signal $\phi_{SE2}$ for the sense amplifiers 6-2. The delay time of the delay circuit 34 ensures complete read-out operation of the memory cells coupled to the word line between the center portion $W_c$ and the far end $W_f$. In general, the delay time of delay circuit 34 is about half the propagation delay time of the word lines over the entire length. The delay circuit 36 has a delay time corresponding to the operation time of sense amplifiers 6-2 and generates timing signal $\phi_{CE2}$ for the column selection circuit 7-2 after the amplifying operation of the sense amplifiers 6-2. The delay circuit 37 has a delay time corresponding to the operation time of the column selection circuit 7-2 and generates the timing signal $\phi_{DOE2}$ after the establishment of the state of the column selection circuit 7-2. The column selection circuits 7-1 and 7-2 are similar in structure and hence the delay circuits 35 and 37 have similar delay characteristics. Also, the sense amplifiers 6-1 and 6-2 are similar in structure and therefore the delay circuits 33 and 36 have similar delay characteristics.

Figure 4:
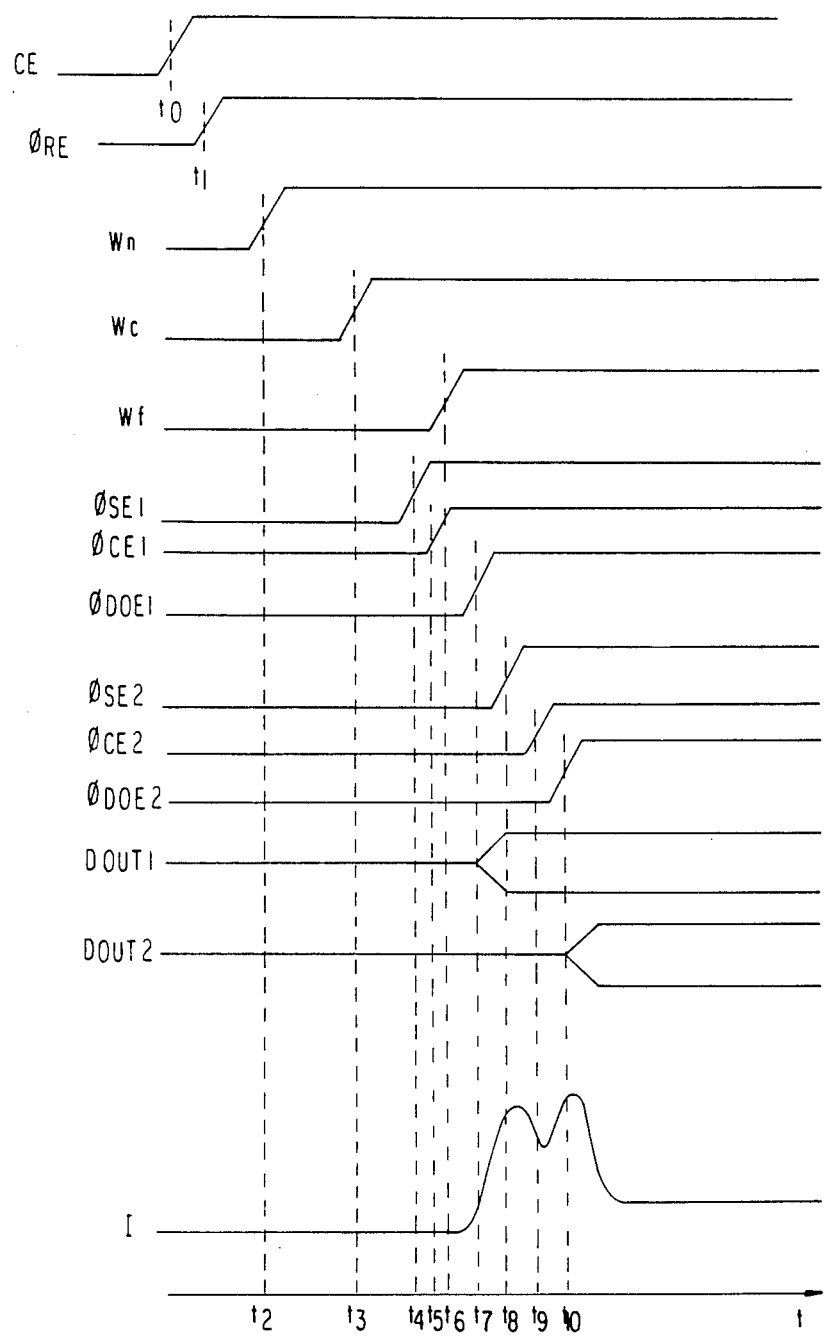

The operation of the memory will be explained with reference to FIG. 4. The chip enable signal CE is activated first at a time point $t_0$. The timing signal $\phi_{RE}$ is activated at a time point $t_1$ so that the row decoder 1 starts to drive the selected word line, e.g., $WL_j$. After the operation time of the row decoder 1 has elapsed, the near end $W_n$ of the word line starts to rise in potential at a time point $t_2$. However, in this instance, the central portion $W_c$ and the far end $W_f$ of the selected word line do not rise in potential because of the propagation delay of the selected word line. The central portion $W_c$ and the far end $W_f$ of the selected word line start to rise in potential at time points $t_3$ and $t_6$, respectively.

At a time point $t_4$, which is after the rise of the central portion $W_c$ of the selected word line, the timing signal $\phi_{SE1}$ for the sense amplifiers 6-1 is activated so that the sense amplifiers 6-1 start their amplification operation to extend level differences in every digit line pair (DG1l, $\overline{DG1l}$) to (DG1n, $\overline{DG1n}$). At the subsequent time point $t_5$, the timing signal $\phi_{CE1}$ for the column selection circuit 7-1 is activated.

One of the digit line pairs (DG1l, $\overline{DG1l}$) to (DG1n, $\overline{DG1n}$) is coupled to the pair of bus lines DB1 and $\overline{DB1}$ through the column selection circuit 7-1. The information to be readout is transferred to the pair of bus lines DB1 and $\overline{DB1}$. At a timing point $t_7$, the timing signal $\phi_{DOE1}$ changes to the active level so that the output circuit D01 develops new output data $D_{OUT1}$. In this instance, if the data $D_{OUT1}$ is a "1" level, a charge current for the load connected to the terminal $D_{OUT1}$ flows through a P-channel transistor Q1 as indicated by "I" in FIG. 4. However, the output circuit $D_{OUT2}$ does not operate at this instance, and therefore the peak value of the current I flowing through the output circuits is remarkably reduced as compared to the prior art.

After the rise of the far end $W_f$ of the word line at the time point $t_6$, the timing signal $\phi_{SE2}$ becomes active at a time point $t_8$ so that sense amplifiers 6-2 start to amplify signal differences in the respective pairs of digit lines (DG2l, $\overline{DG2l}$) to (DG2n, $\overline{DG2n}$). At a time point $t_9$, the timing signal $\phi_{CE2}$ for the column selection circuit 7-2 becomes active so that the column selection circuit 7-2 transfers data on a selected pair of digit lines to the bus lines DB2 and $\overline{DB2}$ based on the column address information Ar. At the subsequent time point $t_{10}$, the timing signal $\phi_{DOE2}$ becomes active. Accordingly, the output circuit DO2 is enabled to amplify data on the bus lines DB2 and $\overline{DB2}$ and generate data at the output terminal $D_{OUT2}$.

In this instance, a switching current flows in the output circuit DO2, and especially when the data at the output terminal $D_{OUT2}$ becomes high in level, a peak current flows through a P-channel transistor. However, in this instance the peak current flowing in the output circuit DO1 is almost negligible. Therefore, the effective peak current flowing in the memory is reduced as shown by "I" in FIG. 4.

As described above, according to the present invention, the output circuits whose switching currents are the main cause of the peak current flowing in the memory are separately activated at different times and therefore, overlap of the respective output circuits' switching currents can be effectively avoided so that the peak value of current flowing in the memory can be reduced. Also, in this embodiment, the sense amplifiers are separately activated according to their groups. This feature further enhances the above advantage.

In addition, each of the output circuits operates at its earliest time. For example, the output circuit starts to operate in response to the timing signal $\phi_{DOE1}$ as soon as the bus lines DB1 and $\overline{DB1}$ receive the read-out data. Therefore, the memory can output a plurality of read-out data at the maximum speed.

Also, according to the reduction of the peak current, a voltage fluctuation in the power voltage wiring due to the voltage drop by the peak current can be reduced. This means that the effective voltage supplied to the sources of the transistors Q1 and Q3 becomes stable. Therefore, the loads connected to the output terminals $D_{OUT1}$ and $D_{OUT2}$ can be charged at a high speed. Thus, the effective operation speed can be further enhanced.

Figure 5:
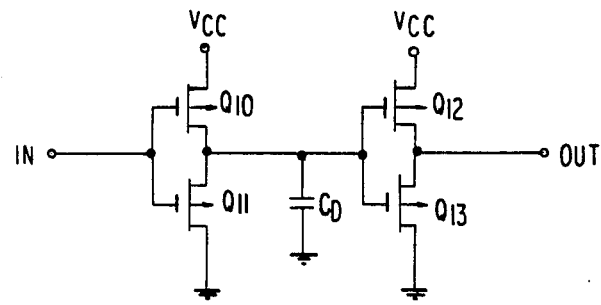
FIG. 5 is a circuit diagram showing one example of the delay circuits employed in the present invention.

In the above embodiment, any optional delay circuits can be employed for the mentioned delay circuits 31 to 37. FIG. 5 shows one example of delay circuits usable as the delay circuits 31 to 37. In FIG. 5, a P-channel transistor $Q_{10}$ and an N-channel transistor $Q_{11}$ form a first inverter receiving an input signal at an input terminal IN. A P-channel transistor $Q_{12}$ and an N-channel transistor $Q_{13}$ forms a second inverter subsequent to the first inverter. The first and second inverters form the basic structure of a delay circuit. A capacitor $C_D$, associated with the output of the first inverter, together with the conductances of the transistors $Q_{10}$ and $Q_{11}$ determines a time constant. This time constant ia the major part of the delay time of the delay circuit. The function of the second inverter is to sharpen the wave-shape of the output therefrom. When a large delay time is required, the above mentioned time constant is designed to be large. It is also possible to connect a plurality of similar circuits in cascade to obtain a desired delay characteristic.

A typical value of $t_8$ when $D_{OUT1}$ is outputted is 12 nsec, and the peak value of the current I is about 1.5 mA for 16K static RAM. It is apparent that the peak current in the present invention is reduced by 50 percent as compared with the prior art.

Figure 6:
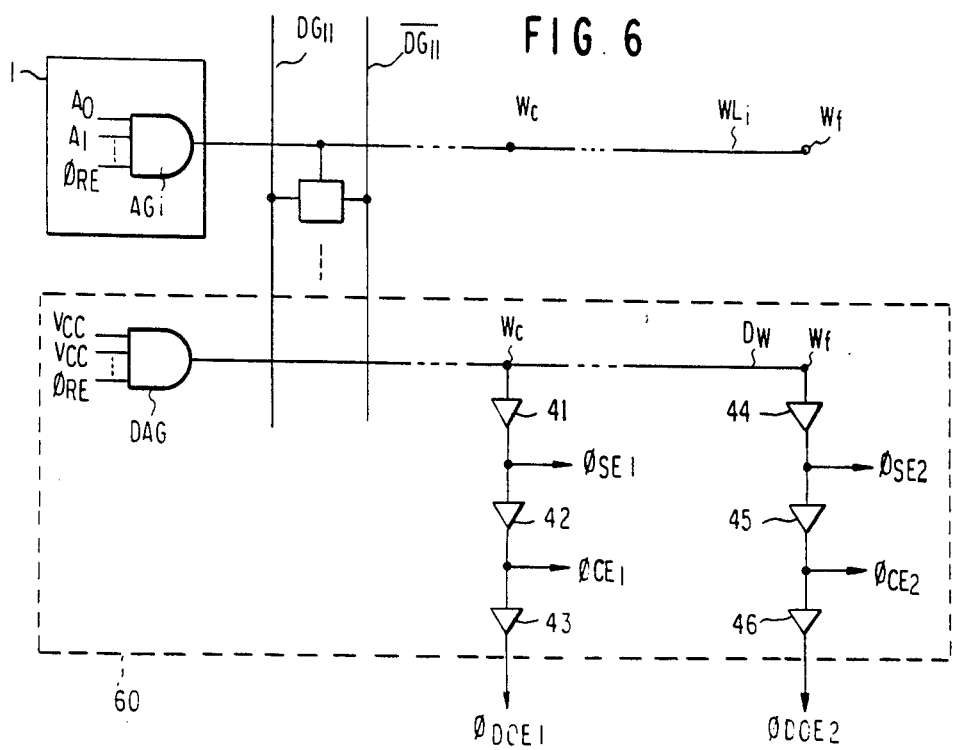
FIG. 6 is a circuit diagram showing another example of the timing circuit.

With reference to FIG. 6, another embodiment of the invention will be explained. This embodiment is achieved by replacing the delay circuits 33 to 37 of FIG. 3a with a signal generator 60 for generating the timing signals $\phi_{SE1}$, $\phi_{SE2}$, $\phi_{CE1}$, $\phi_{CE2}$, $\phi_{DOE1}$ and $\phi_{DOE}$.

A dummy word line DW is provided in the memory cell array. The dummy word line DW has a structure similar to the word lines such as $WL_i$. Namely, the dummy word line DW intersects with all the digit lines. Thus, the dummy word line DW has the same electrical characteristics, especially the same signal propagation characteristics, as the other word lines. Also, a dummy decoder DAG is connected to the dummy word line DW. The dummy decoder DAG has a structure similar to the decoder $AG_i$ for the word line $WL_i$ except that instead of applying address signals A0, A1 . . . to the inputs of the decoder $AG_i$, the power voltage Vcc is applied to inputs of the dummy decoder DAG having an AND logic structure. Therefore, the dummy decoder DAG derives the dummy word line DW towards the selection level every time the timing signal $\phi_{RE}$ reaches the active level, that is, every time any one of the word lines is selected. The delay circuits 41, 42 and 43 are connected in cascade to the center portion $W_c$ of the dummy word line DW. The timing signals $\phi_{SE1}$, $\phi_{CE1}$ and $\phi_{DOE1}$ are generated from the delay circuits 41, 42 and 43, respectively. The delay circuits 44, 45 and 46 are connected in cascade to the far end Wf of the dummy word line DW and generate the timing signals $\phi_{SE2}$, $\phi_{CE2}$ and $\phi_{DOE2}$, respectively.

According to this embodiment, the dummy word line DW has the same propagation characteristic as the selected word line so that the dummy word line DW provides ideal delay time which is required for the selection signal to be transmitted from the central portion $W_c$ of the selected word line to its far end $W_f$.

Although the present invention has been explained in connection with a preferred embodiment, it should be apparent that the present invention is not limited to the above embodiment. For example, the present invention is applicable not only to random access memories but also to read only memories. Also, the number of the output circuits is not limited to two, but the present invention is also applicable to memories with three or more output circuits.

What is claimed is:

1. In a multibit-output memory circuit of the type having,
a plurality of memory cells arranged at the intersection of at least one word line and a plurality of bit lines, said word line connected to at least first and second groups of adjacent memory cells, means for applying a word line active signal to said word line whereby the delay characteristics of said word line results in the sequential application of said signal to said first and second groups of adjacent memory cells, at least first and second output circuits associated with said first and second groups of adjacent memory cells, respectively, and at least first and second selection means associated with said first and second groups of adjacent memory cells, respectively, each said selection means being operable to selectively connect the bit lines associated with a selected memory cell to an associated output circuit, the improvement comprising:
means for applying activating timing signals to said selection means and output circuits to cause operation of said selection means and output circuits in a sequence according to the memory cell groups to which they are associated and the nearness of said groups to the application point in said word line of said word line active signal, wherein said means for applying comprises,
first timing means for applying an activation timing signal to said first selection means and a subsequent activation timing signal to said first output circuit to enable the operation of said means and said circuit after said word line active signal is applied to all said memory cells in said first group,
second timing means for applying an activation timing signal to said second selection means and a subsequent activation timing signal to said second output circuit to enable the operation of said means and said circuit after said word line active signal is applied to all said memory cells in said second group,
wherein said second selection means is activated after said first selection means, and said second output circuit is activated after said first output circuit.

2. A multibit-output memory circuit as claimed in claim 1 wherein said first timing means applies said activation timing signal to said first selection means prior to said word line active signal being applied to all said memory cells in said second group. memory cells, means for applying a word line active signal to said word line whereby the delay characteristics of said word line results in the sequential application of said signal to said first and second groups of adjacent memory cells, at least first and second output circuits associated with said first and second groups of adjacent memory cells, respectively, and at least first and second selection means associated with said first and second groups of adjacent memory cells, respectively, each said selection means being operable to selectively connect the bit lines associated with a selected memory cell to an associated output circuit, the improvement comprising:
means for applying activating timing signals to said selection means and output circuits to cause operation of said selection means and output circuits in a sequence according to the memory cell groups to which they are associated and the nearness of said groups to the application point in said word line of said word line active signal, wherein said means for applying comprises,
first timing means for applying an activation timing signal to said first selection means and a subsequent activation timing signal to said first output circuit to enable the operation of said means and said circuit after said word line active signal is applied to all said memory cells in said first group,
second timing means for applying an activation timing signal to said second selection means and a subsequent activation timing signal to said second output circuit to enable the operation of said means and said circuit after said word line active signal is applied to all said memory cells in said second group,
wherein said second selection means is activated after said first selection means, and said second output circuit is activated after said first output circuit.

3. In a multibit-output memory circuit of the type having,
a plurality of memory cells arranged at the intersection of at least one word line and a plurality of bit lines, said word line and a plurality of bit lines, said word line connected to at least first and second groups of adjacent memory cells, means for applying a word line active signal to said line whereby the delay characteristics of said word line results in the sequential application of said signal to said first and second groups of adjacent memory cells, at least first and second output circuits associated with said first and second groups of adjacent memory cells, respectively, and at least first and second selection means associated with said first and second groups of adjacent memory cells, respectively, each said selection means being operable to selectively connected the bit lines associated with a selected memory cell to an associated output circuit, the improvement comprising:

means for applying activating timing signals to said selection means and output circuits to cause operation of said selection means and output circuits in a sequence according to the memory cell groups to which they are associated and the nearness of said groups to the application point in said word line of said word line active signal;

wherein said plurality of bit lines comprises a separate pair of bit lines connected to each of said memory cells;

said memory further comprising a plurality of sense amplifiers equal in number to and respectively associated with the plurality of memory cells connected to said word line, said sense amplifiers being connected respectively to said pairs of bit lines and being divided into at least first and second groups of sense amplifiers corresponding to said first and second groups of memory cells, said sense amplifiers being operative to amplify bit signals on associated bit lines; and wherein said means for applying additionally applies activating timing signals to said first and second sense amplifiers to cause them to operate in sequence.

4. A multibit-output memory circuit as claimed in claim 3 wherein said means for applying comprises, first timing means for generating a first sense amplifier timing signal to enable said first group of sense amplifiers substantially immediately upon said word line active signal being applied to the last memory cell of said first group of memory cells, second timing means for generating a first selection means timing signal to enable said first selection means substantially immediately after said first group of sense amplifiers operate to amplify their respective bit signals, third timing means for generating a first output circuit timing signal to enable said first output circuit substantially immediately after said first selection means operates to select a pair of bit lines, fourth timing means for generating a second sense amplifier timing signal to enable said second group of sense amplifiers substantially immediately upon said word line active signal being applied to the last memory cell of said second group of memory cells, fifth timing means for generating a second selection means timing signal to enable said second selection means substantially immediately after said second group of sense amplifiers operate to amplify their respective bit signals, and sixth timing means for generating a second output circuit timing signal to enable said second output circuit substantially immediately after said second selection means operates to select a pair of bit lines.

5. A multibit-output memory circuit as claimed in claim 4 wherein said memory circuit further comprises a word address selection means for selecting a word line in accordance with an externally applied word address, and a first delay circuit responsive to an externally applied chip enable signal to generate a word select timing signal to enable said word address selection means to apply a word line active signal to said selected word line, and wherein said first through said sixth timing circuits consist of second through seventh delay circuits, respectively, connected as follows:

said second, third and fourth delay circuits connected in cascade to successively delay the output from said first delay circuit to generate said first sense amplifier timing signal, said first selection means timing signal, and said first output circuit timing signal, respectively, said, fifth, sixth and seventh delay circuits connected in cascade to successively delay the output from said second delay circuit to generate said second sense amplifier timing signal, and second selection means timing signal, and said second output circuit timing signal, respectively.

6. A multibit-memory according to claim 1, in which each of said output circuits includes a first transistor of a first conductivity type and a second transistor of a second conductivity type connected in series between power voltages.

7. A memory circuit comprising a word line having first and second ends, a plurality of digit lines intersecting with said word lines, a plurality of memory cells arranged at the intersections of said word line and said digit lines, a row decoder coupled to said first end of said word line, said memory cells being divided into first and second groups, said first group of memory cells being coupled to said word line between said first end and an intermediate portion between said first and second ends, said second group of memory cells being coupled to said word line between said intermediate portion and said second ends, a first output circuit adapted to receive a signal from said first group of memory cells, a second output circuit adapted to receive a signal from said second group of memory cells, a first control circuit for enabling said first output circuit after said first group of memory cells coupled to the selected word line are selected by said selected word line, and a second control circuit for enabling said second output circuit after said first group of memory cells coupled to said selected word line are selected by said selected word line, wherein said second output circuit is enabled after said first output circuit.

8. In a multibit-output memory circuit of the type having, a plurality of memory cells arranged at the intersection of at least one word line and a plurality of bit lines, said word line connected to at least first and second groups of adjacent memory cells, means for applying a word line active signal to said word line whereby the delay characteristics of said word line results in the sequential application of said signal to said first and second groups of adjacent memory cells, at least first and second output circuits associated with said first and second groups of adjacent memory cells, respectively, and at least first and second selection means associated with said first and second groups of adjacent memory cells, respectively, each said selection means being operable to selectively connect the bit lines associated with a selected memory cell to an associated output circuit, the improvement comprising:

control means for applying activating timing signals to said output circuits to cause operation of said output circuits in a sequence according the memory cell groups to which they are associated and the nearness of said groups to the application point in said word line of said word line active signal, said control means including, first timing means for applying an activation timing signal to said first output circuit to enable the operation of said first output circuit after said word line active signal is applied to all said memory cells in said first group, and second timing means for applying an activation timing signal to said second output circuit to enable the operation of said second output circuit after said word line active signal is applied to all said memory cells in said second group, wherein said second output circuit is activated after said first output circuit.

9. A multibit-output memory circuit as claimed in claim 8 wherein said first timing means applies said activation timing signal to said first selection means prior to said word line active signal is applied to all said memory cells in said second group.

10. A multibit-output memory circuit of the type having, a plurality of memory cells arranged at the intersection of at least one word line and a plurality of bit lines, said word line connected to at least first and second groups of adjacent memory cells, means for applying a word line active signal to said word line whereby the delay characteristics of said word line results in the sequential application of said signal to said first and second groups of adjacent memory cells, at least first and second output circuits associated with said first and second groups of adjacent memory cells, respectively, and at least first and second selection means associated with said first and second groups of adjacent memory cells, respectively, each said selection means being operable to selectively connect the bit lines associated with a selected memory cell to an associated output circuit, means for applying activating timing signals to said output circuits to cause operation of said output circuits in a sequence, according to the memory cell groups to which they are associated and the nearness of said groups to the application point in said word line of said word line active signal, said plurality of bit lines including a separate pair of bit lines connected to each of said memory cells, and a plurality of sense amplifiers equal in number to and respectively associated with the plurality of memory cells connected to said word line, said sense amplifiers being connected respectively to said pairs of bit lines and being divided into at least first and second groups of sense amplifiers corresponding to said first and second groups of memory cells, said sense amplifiers being operative to amplify bit signals on associated bit lines, wherein said means for applying additionally applies activating timing signals to said first and second sense amplifiers to cause them to operate in sequence.

* * * * *

UNITED STATES PATENT AND TRADEMARK OFFICE
CERTIFICATE OF CORRECTION

PATENT NO. : 4,635,234
DATED : January 6, 1987
INVENTOR(S) : T. YAMAGUCHI

It is certified that error appears in the above-identified patent and that said Letters Patent is hereby corrected as shown below:

Column 2, line 40   Delete "21 to 25" and insert —21 to 24— ;

Column 6, line 1    Delete "$t_g$" and insert —$t_9$—;

Column 6, line 56   Delete "ia" and insert —is—;

Column 8, line 25-62 Delete after "second group." the remainder of the text comprising "memory cells . . . . output circuit."

Signed and Sealed this

First Day of March, 1988

Attest:

DONALD J. QUIGG

Attesting Officer          Commissioner of Patents and Trademarks